(12) United States Patent
Sano et al.

(10) Patent No.: US 8,319,514 B2
(45) Date of Patent: Nov. 27, 2012

(54) METHOD AND PROGRAM FOR OPERATING TEST APPARATUS

(75) Inventors: Satoshi Sano, Nirasaki (JP); Shinji Kojima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 12/851,817

(22) Filed: Aug. 6, 2010

(65) Prior Publication Data

US 2011/0050276 A1 Mar. 3, 2011

(30) Foreign Application Priority Data

Aug. 11, 2009 (JP) .................................. 2009-186913

(51) Int. Cl.
*G01R 31/26* (2006.01)

(52) U.S. Cl. ................................. 324/762.05

(58) Field of Classification Search ........................ None
See application file for complete search history.

(56) References Cited

U.S. PATENT DOCUMENTS 4,070,565 A * 1/1978 Borrelli ........................ 714/734
7,701,236 B2 * 4/2010 Akiyama et al. ......... 324/750.16

FOREIGN PATENT DOCUMENTS

JP 2006277406 A * 10/2006
JP 2008077358 A * 4/2008

* cited by examiner

*Primary Examiner* — Jermele M Hollington
(74) *Attorney, Agent, or Firm* — Abelman, Frayne & Schwab

(57) ABSTRACT

Disclosed is a method for operating a test apparatus in which the testing efficiency is drastically increased. The test apparatus has a plurality of stages for testing wafers by using operation buttons displayed on the operating screens of each of a plurality of monitors. Exclusion condition buttons for excluding operation buttons are set in at least one monitor using exclusion condition data prepared by combining data required to perform various functions of the test apparatus and an exclusion condition pattern prepared by combining the exclusion condition of the exclusion condition data into data for deciding whether the operating button configured to operate each function can be pressed or not. Also, display of the screen that satisfies the exclusion condition for at least one monitor is prevented.

5 Claims, 11 Drawing Sheets

FIG.4

[Button press condition pattern]

| No. | Conditions |
|---|---|
| 1 | Is operation mode of main screen system mode? |
| 2 | Is there set carrier in port 1? |
| 3 | Is port 1 on test? |
| . | ............. |
| . | ............. |
| . | ............. |

[Screen exclusion condition setting data]

| ScreenID | MAIN_01 |
|---|---|
| Button name | Exclusion condition No. |
| S1 | 1 |
| S2 | A(2:3) |
| S3 | O(4:5) |
| . | ............. |
| . | ............. |

FIG. 5(a)

| ScreenID | MAIN_02 |
|---|---|
| Button name | Exclusion condition No. |
| S1 | 1 |
| S2 | A(1:2:3) |
| S3 | 5 |
| . | ............. |
| . | ............. |

FIG. 5(b)

METHOD AND PROGRAM FOR OPERATING TEST APPARATUS

This application is based on and claims priority from Japanese Patent Application No. 2009-186913, filed on Aug. 11, 2009, with the Japanese Patent Office, the disclosure of which is incorporated herein in its entirety by reference.

TECHNICAL FIELD

The present disclosure relates to a method and a program for operating a test apparatus, more particularly, to a method and a program that can make an effective use of a test apparatus having a plurality of stages.

BACKGROUND

A test apparatus 1 having a plurality of stages 4, for example, as shown FIG. 12, has a loader chamber 3 provided with a carrying mechanism 2 for carrying semiconductor wafers, a plurality of stages (e.g., 4 stages) on which the semiconductor wafers carried via carrying mechanism 2 are disposed, and a prober chamber 5 provided with a plurality of probe cards (not shown) each disposed over each stage 4. The semiconductor wafers are tested by electrically contacting a plurality of probes of the probe cards with electrode pads of the semiconductor wafers on the plurality of stages 4 in prober chamber 5.

In loader chamber 3, load ports 6, in which carriers are disposed, are disposed at left and right sides while being separated from each other. Semiconductor wafers are carried by carrying mechanism 2 between the carriers in each load port 6 and the plurality of stages 4. Also, monitors (not shown) are provided at loader chamber 3 and probe chamber 5 for monitoring each chamber and for operating devices in each chamber. The test apparatus is operated and managed by operation screens displayed on display screens of the monitors. The operation screens on the monitors are configured to be changed step by step from super-ordinate operation screens to sub-ordinate operation screens by operation buttons displayed therein. Also, various devices provided in loader chamber 3 and prober chamber 5 are operated by pressing the operation buttons displayed on each operation screen so as to carry out the function assigned to each operation button.

Test apparatuses 1 are thus disposed together in a testing region of a clean room in a matrix form, for example, as shown in FIG. 12, and there is only a small gap between the test apparatuses arranged in a transverse direction. Also, in FIG. 12, the reference numeral P designates pillars of the clean room.

At a side of loader chamber 3 of test apparatus 1, desired numbers of monitors are disposed for conducting operations for testing from beginning to end. At a side of prober chamber 5 of test apparatus 1, desired numbers of monitors are disposed for conducting operations for maintenance or change of probe cards in prober chamber 5. The monitors provided in loader chamber 3 and prober chamber 5 that faces test apparatus 1 are used separately from each other.

However, because the number of operable monitors is restricted to only one, even though there are multiple monitors, other monitors except the one in operation could not be used. For example, when an operator stops testing and conducts operations such as, for example, changing probe cards or maintenance of stages (hereinafter, represented by the term "maintenance") by using the monitor at the side of prober chamber 5 for a long time, the other monitors could not be operated and the entire test apparatus may be halted. Thus, the operator may not be able to instruct a testing from the monitor of loader chamber 3 to the other stages of prober chamber 5 not being in operation of maintenance. Therefore, there is a problem that the operation efficiency is decreased.

SUMMARY

According to an exemplary embodiment, there is provided a method for operating a test apparatus having a plurality of stages for testing wafers by using an operation button in an operation screen displayed on each of a plurality of monitors. The method comprises a process of providing exclusion condition data that combines functional data required for operating various functions of the test apparatus into an exclusion condition, and an exclusion condition pattern that combines the exclusion condition into data for determining whether the operating button configured to operate each function can be pressed or not. The method also includes the processes of providing an exclusion condition button to one or more monitors for excluding the operation button according to an operating condition of the test apparatus, determining the exclusion condition of the exclusion condition button with reference to the exclusion condition data and the exclusion condition pattern by pressing the exclusion condition button, and preventing a screen satisfying the exclusion condition on the one or more monitors from being displayed on other monitors based on the determining.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a view illustrating a pattern for a press condition of the operating button displayed on the monitor used for conducting the method for operating the test apparatus shown in FIG. 1.

FIGS. 5(a) and 5(b) each illustrate data for setting the exclusion condition of the screen set by using the data table shown in FIG. 4.

DETAILED DESCRIPTION

Figure 1:
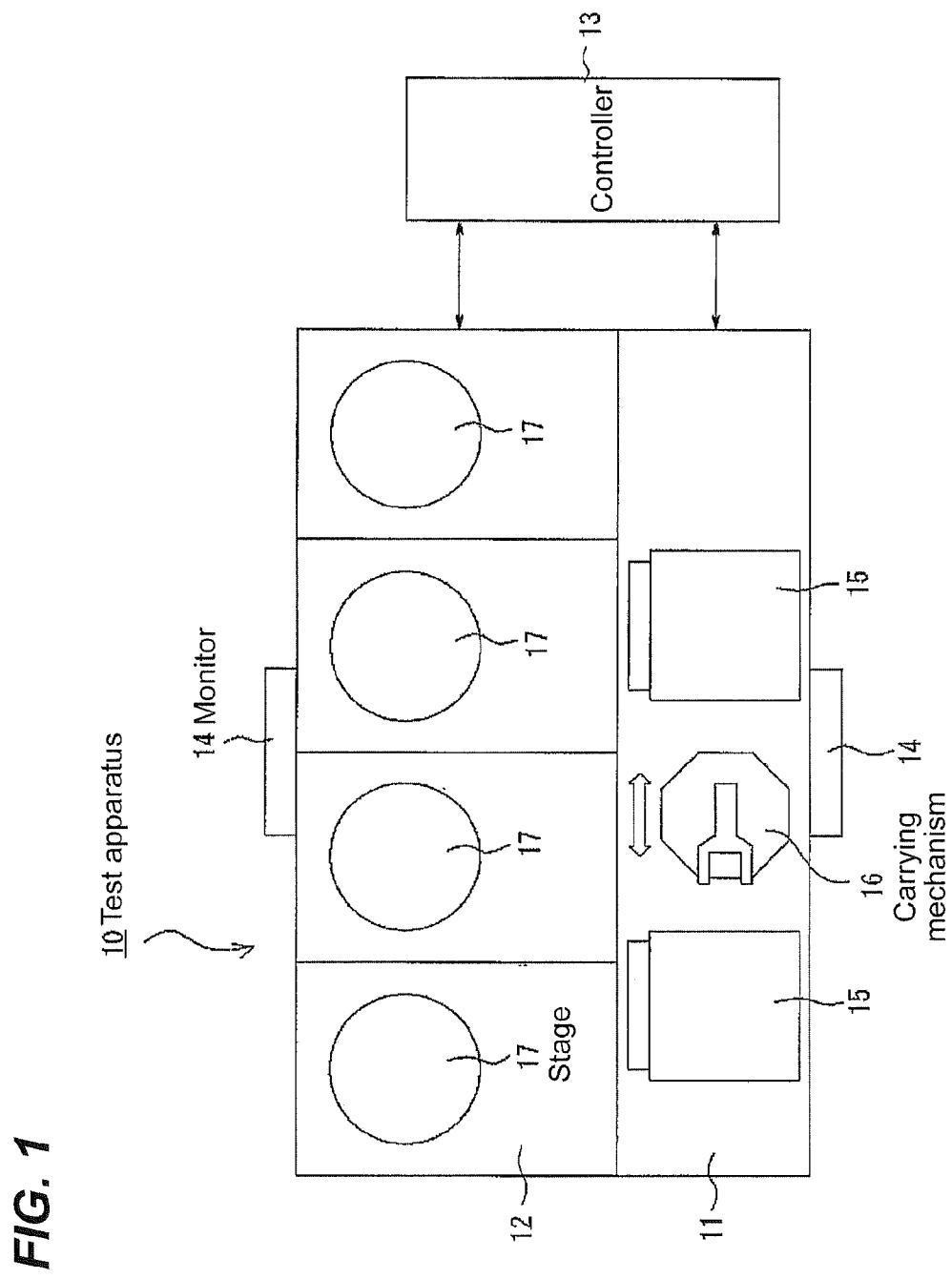
FIG. 1 is a top plan view illustrating an example of a test apparatus to which the method for operating the test apparatus is applied, according to the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a method and a program for operating a test apparatus having a plurality of stages in which the display of an operation screen itself used at a stage or an operation button provided inside the operation screen is prohibited in other monitors, and a continuous operation is allowed in other monitors without determining the stage, thereby increasing the operation efficiency of the test apparatus substantially.

In an exemplary embodiment of the present disclosure, there is provided a method for operating a test apparatus having a plurality of stages for testing wafers by using an operation button in an operation screen displayed on each of a plurality of monitors. The method comprises a process of providing exclusion condition data that combines functional data required for operating various functions of the test apparatus into an exclusion condition, and an exclusion condition pattern that combines the exclusion condition into data for deciding whether the operating button configured to operate each function can be pressed or not. The method further includes providing an exclusion condition button to one or more monitors for excluding the operation button according to an operating condition of the test apparatus, determining the exclusion condition of the exclusion condition button with reference to the exclusion condition data and the exclusion condition pattern by pressing the exclusion condition button, and preventing a screen satisfying the exclusion condition on the one or more monitors from being displayed on other monitors based on the determining decision.

In particular, each of the monitors may display a plurality of stage screens, each of which is assigned to each stage, and a main screen in addition to the stage screens.

Also, an operation mode may be displayed operation on each of the stage screens and main screen, and the operation mode includes an operator mode used for testing semiconductor wafers and a system mode used for conducting a predetermined operation while stopping a selected stage.

Also, the other monitors may not display the system mode when the system mode is displayed on the one or more monitors.

Also, there may be provided a computer-readable recording medium storing a computer executable program that, when executed, causes a computer to perform the method of the present disclosure for operating a test apparatus having a plurality of stages for testing electrical characteristics of semiconductor wafers.

According to the present disclosure, in the test apparatus having a plurality of stages, the display of an operation screen for a monitor itself used at a stage or an operation button provided inside the operation screen is prohibited in other monitors, and a continuous operation is allowed without stopping in other monitors, thereby increasing the operation efficiency of the test apparatus substantially.

An Exemplary Embodiment

Hereinafter, the present disclosure will be described based on the exemplary embodiment as shown in FIG. 1 to FIG. 12.

First, the test apparatus will be described to which the method for operating the test apparatus according to the present disclosure is applied. As shown in FIG. 1, a test apparatus 10 includes a loader chamber 11 carrying semiconductor wafers, a prober chamber 12 conducting a test of electrical characteristics of the semiconductor wafers, a controller 13 controlling each device in loader chamber 11 and prober chamber 12, and monitors 14 monitoring and operating each device in loader chamber 11 and prober chamber 12. Electrical characteristics of the semiconductor wafers are tested by pressing operation buttons displayed on operation screens of monitor 14 so as to operate control device 13 to operate each device in loader chamber 11 and prober chamber 12 for testing.

Loader chamber 11 includes two load ports 15 at left and right sides, in which semiconductor wafers are disposed with carrier unit, and a wafer carrying mechanism 16 carrying semiconductor wafers between each carrier (not shown) on load ports 15 and prober chamber 12.

Prober chamber 12 includes 4 stages 17 disposed along loader chamber 11, 4 probe cards (not shown) each disposed at an upper side of each stage 17, and an alignment mechanism (not shown) for conducting alignment between electrode pads of semiconductor wafers on stages 17 and a plurality of probes on the probe cards. Also, prober chamber 12 is configured such that each stage 17 loads a semiconductor wafer thereon and moves in a horizontal direction and a vertical direction within a predetermined range. In prober chamber 12, after the semiconductor wafers disposed on stages 17 are aligned with the probe cards, electrode pads of the semiconductor wafers on each stage 17 and a plurality of probes on the probe cards are electrically contacted, thereby testing electrical characteristics of the semiconductor wafers based on a command signal from a tester (not shown). Also, in FIG. 1, each of 4 stages 17 in prober chamber 12 is separately sectioned from each other by partitions. However, the stages may not be sectioned by the partitions.

Controller 13 includes a computer having, among others, a central processor unit and a memory unit storing various data used for testing or various programs such as a program for operating the test apparatus according to the present disclosure. Upon pressing an operation button displayed on a display screen of monitors 14, the central processor unit and the memory unit collaborate to carry out the functions assigned to the button so as to operate and control each device in loader chamber 11 and prober chamber 12.

Monitor 14 is disposed, for example, on each of loader chamber 11 and prober chamber 12, as shown in FIG. 1. The number of monitor 14 may be increased as required. An operation screen is displayed for operating test apparatus 10 on the display screen of monitor 14. Two operation modes of an operator mode and a system mode may be provided in an operation screen of monitor 14 and these two modes of operation may be switched appropriately as required. The operator mode is an operation mode used by an operator to operate test apparatus 10. The system mode is an operation mode used for conducting operations such as the maintenance of stages 17 or wafer carrying mechanism 16 in loader chamber 11 or change of probe cards in prober chamber 12.

Figure 2A:
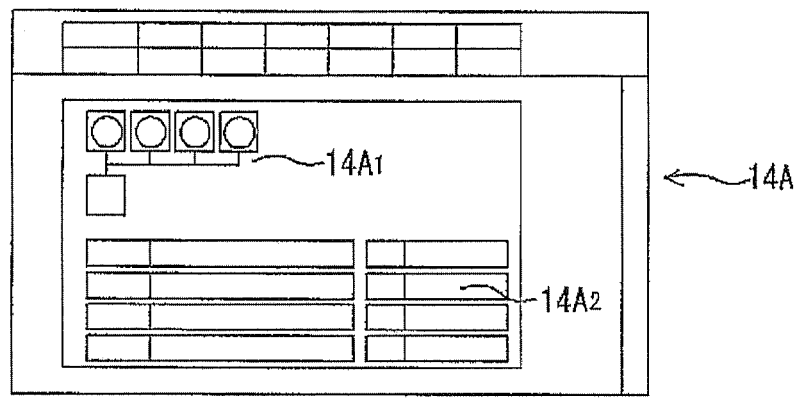
FIGS. 2 (a) and (b) each illustrates an operating screen displayed on the monitor shown in FIG. 1.
Figure 2B:
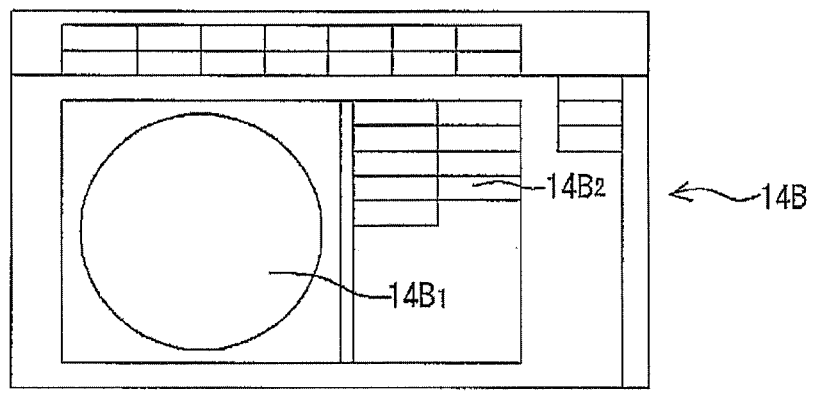

As shown in FIGS. 2(a), 2(b), operation screen 14 is composed of two groups including, for example, a plurality of stage screens assigned to four stages 17 provided to the operations related to each stage 17 of test apparatus 10 (FIG. 2(b)), and a main screen used for other operations than the operations related to stage 17 (FIG. 2(a)).

In main screen 14A, there are displayed, for example, a layout view 14A1 illustrating the entire layout of loader chamber 11 and prober chamber 12 or a plurality of operation buttons 14A2 that executes the operation menu of test apparatus 10 as shown in FIG. 2(a). In stage screen 14B, there are displayed, for example, a stage view 14B1 or a plurality of operation buttons 14B2 that executes the operation menu of stage 17 as shown in FIG. 2(b). Each of main screen 14A and stage screen 14B is alternately switched between the operator mode and the system mode. Each of main screen 14A and stage screen 14B can change the operation screen from a super-ordinate operation screen to a subordinate operation screen, and can set various conditions or give instructions by using operation buttons on each operation screen.

The method for operating a test apparatus according to the present exemplary embodiment (hereinafter, "operation method") can be practiced by installing the program for operating the test apparatus according to the present disclosure (hereinafter, "operation program") into controller 13. By applying the operation method according to the present exemplary embodiment, the exclusion processes of various operation screens themselves or operation buttons on each operation screen can be accomplished. Since the exclusion process prevents the operation screen or the operation button from being displayed on the display screen of monitor 14, each of the excluded operation screens or operation buttons may not be operated. For example, when a stage screen of monitor 14 is switched from the operation mode to the system mode to conduct a maintenance operation of one stage 17 or a change operation of a probe card, the stage screen 14B for operating the relevant stage 17 is not displayed in the other monitors 14 so that the stage 17 cannot be operated from the other monitor 14.

Figure 3:
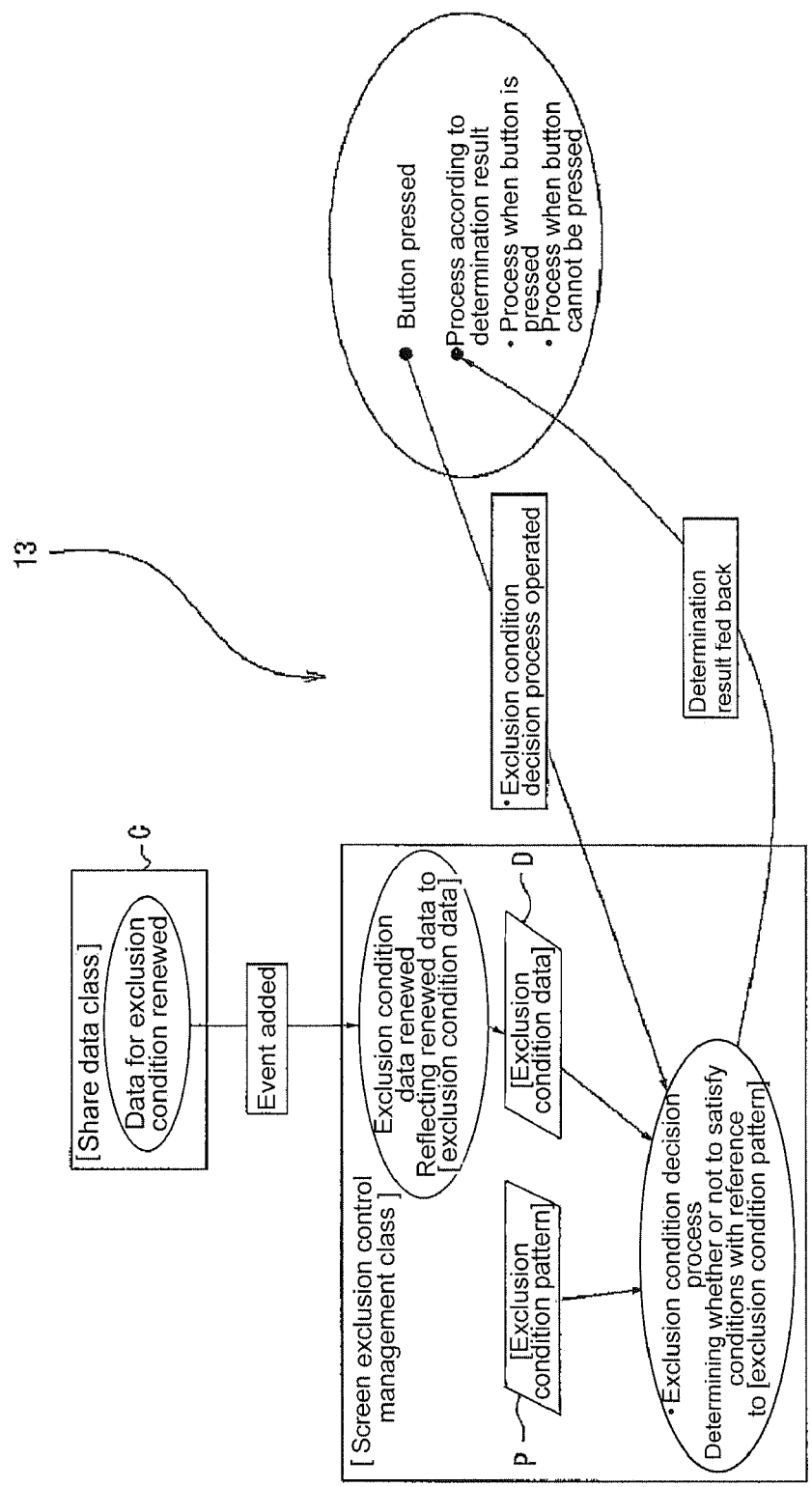
FIG. 3 is a conceptual view illustrating an embodiment of the method for operating the test apparatus, according to the present disclosure.

Next, the operation method of the present embodiment will be described with reference to FIG. 1 to FIG. 11. The operation method of the present embodiment runs the operation program in controller 13 so as to carry out a screen exclusion control function. The control function of the screen exclusion is to exclude an operation screen or an operation mode of a predetermined monitor 14 so as not to be displayed on the other monitors 14, by pressing an exclusion condition button described below. FIG. 3 is a conceptual view illustrating a control process of the screen exclusion.

As shown in FIG. 3, various functions of the entire test apparatus 10 are memorized together as a share data class C in the memory unit of controller 13. Data for operating test apparatus 10 are obtained from the share data class C. When the data needs to be changed, the data may be designated by a keyword. The share data class C issues an event when the date are changed. The event is assigned with a keyword and the changed data can be recognized based on the keyword.

Upon pressing an exclusion condition button used for a screen exclusion control process in an operation screen displayed on a display screen of monitor 14, the central processing unit of controller 13 refers to the condition data D and the exclusion condition pattern P stored in the memory unit, determines which operation screen or operation button needs to be excluded, and returns the determination result to the operation screen that has initiated the button operation. The exclusion condition data D used herein are data required for excluding the operation screen or the operation buttons, and obtained from the share data class C as exclusion conditions. The exclusion condition data D can be renewed based on an event notice from the share data class C. The exclusion condition pattern P is such that at least one exclusion condition is set to each operation button in an operation screen. Also, while the exclusion condition pattern P is set to each operation button in the operation screen, an operation button with no exclusion condition is always displayed in the operation screen because it is not an object of exclusion process.

The exclusion condition pattern P combines the condition of whether an operation button can be pressed, and includes a condition pattern of a button press shown in FIG. 4 and setting data for screen exclusion condition shown in FIGS. 5 (a) and (b). The conditional pattern of the button press is data in which a plurality of button press conditions and each associated number thereof are stored together in a table as shown in FIG. 4. For example, in the present exemplary embodiment, the button press conditions are stored in a structural arrangement of string-typed letter lines. Also, the data structure may be a binary type. The setting data for screen exclusion condition are data for setting exclusion conditions for the operation buttons included in each operation screen of each of main screen 14A and stage screen 14B. As shown in FIGS. 5(a) and 5(b), the setting data for screen exclusion condition comprises button IDs (expressed by button names in FIGS. 5(a) and 5(b)) and exclusion conditions. The exclusion conditions are set and displayed by selecting at least one of the conditions (data) in the pattern for the button press condition and using the number (No.) assigned to the selected data.

For example, the exclusion condition A(2:3) for button S2 shown in FIG. 5(a) is set by the pressing process of the operating buttons assigned for defining exclusion condition A and number buttons 2 and 3 of ten key by using an input device. The exclusion condition O(4:5) of button S3 is set by the pressing process of the operation buttons assigned for defining exclusion condition O, and number buttons 4 and 5 of ten key by using the input device. Also, for example, the exclusion condition O(A(1:2):A(3:4)) which includes exclusion condition A and exclusion condition O as an exclusion condition pattern, is set by combining and inputting operation buttons of each of the predetermined exclusion conditions A and O, and the predetermined numbers in number buttons of ten key. Here, exclusion condition A represents an AND process operated only when all of the exclusion conditions in the parenthesis is satisfied. Thus, if any one of the exclusion conditions in the parenthesis is not satisfied, an NG is determined. Also, the exclusion condition O represents an OR process operated when at least one of the exclusion conditions in the parenthesis is satisfied. Thus, if all exclusion conditions in the parenthesis are not satisfied, an NG is determined.

Figure 6:
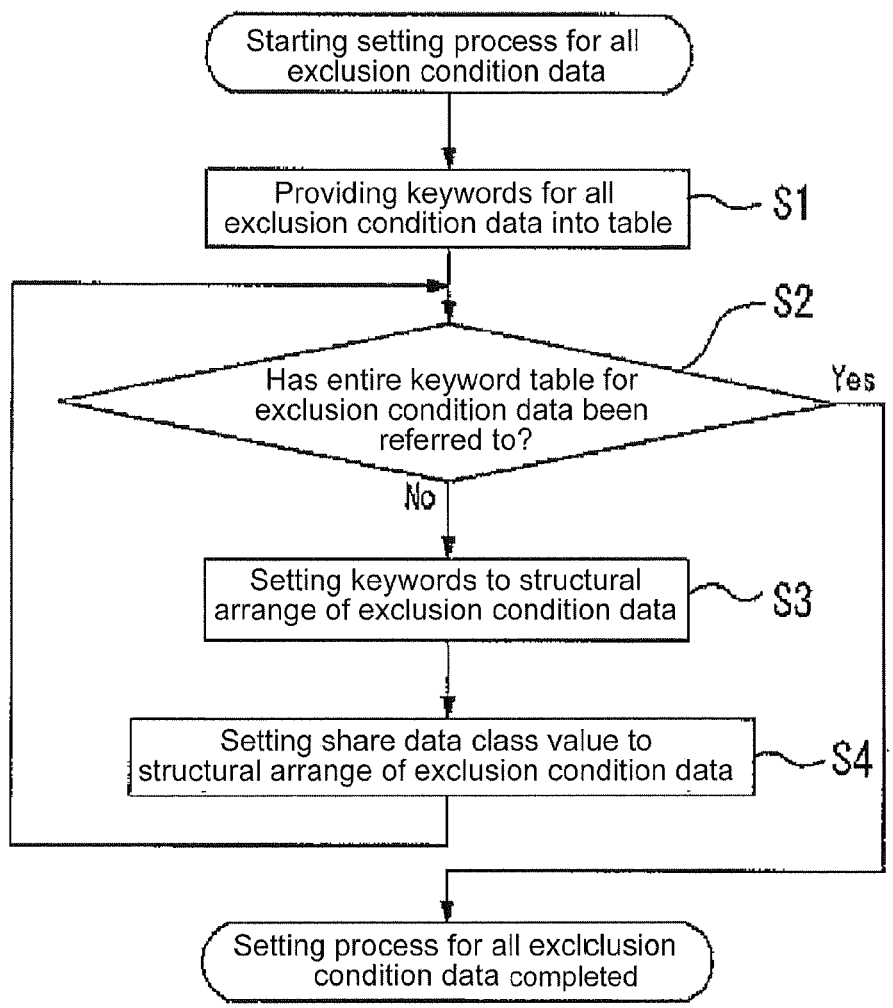
FIG. 6 is a flow chart for setting the data for setting the exclusion condition of the screen shown in FIGS. 5(a) and 5(b).

All the exclusion condition data D is set as the setting data for the screen exclusion condition according to the flow shown, for example, in FIG. 6. Upon starting the process for setting all of the exclusion condition data, keywords (e.g., letter string 1) are assigned to all of the exclusion condition data D so as to provide a keyword table incorporating all of the exclusion condition data D (step S1), as shown in FIG. 4. Then, it is determined whether the entire keyword table of exclusion condition data D has been referred to or not (step S2). If it is determined that all of the keywords in the keyword table has not been referred to, keywords are set to the string-typed structural arrange of exclusion condition data D (step S3). Continuously, the value of the share data class C is set to the structural arrange of exclusion condition data D (step S4), and then, steps S2, S3 and S4 are repeated. At step S2, however, if it is determined that all of the keywords has been referred to, the setting of all of the exclusion condition data D is completed.

Figure 7:
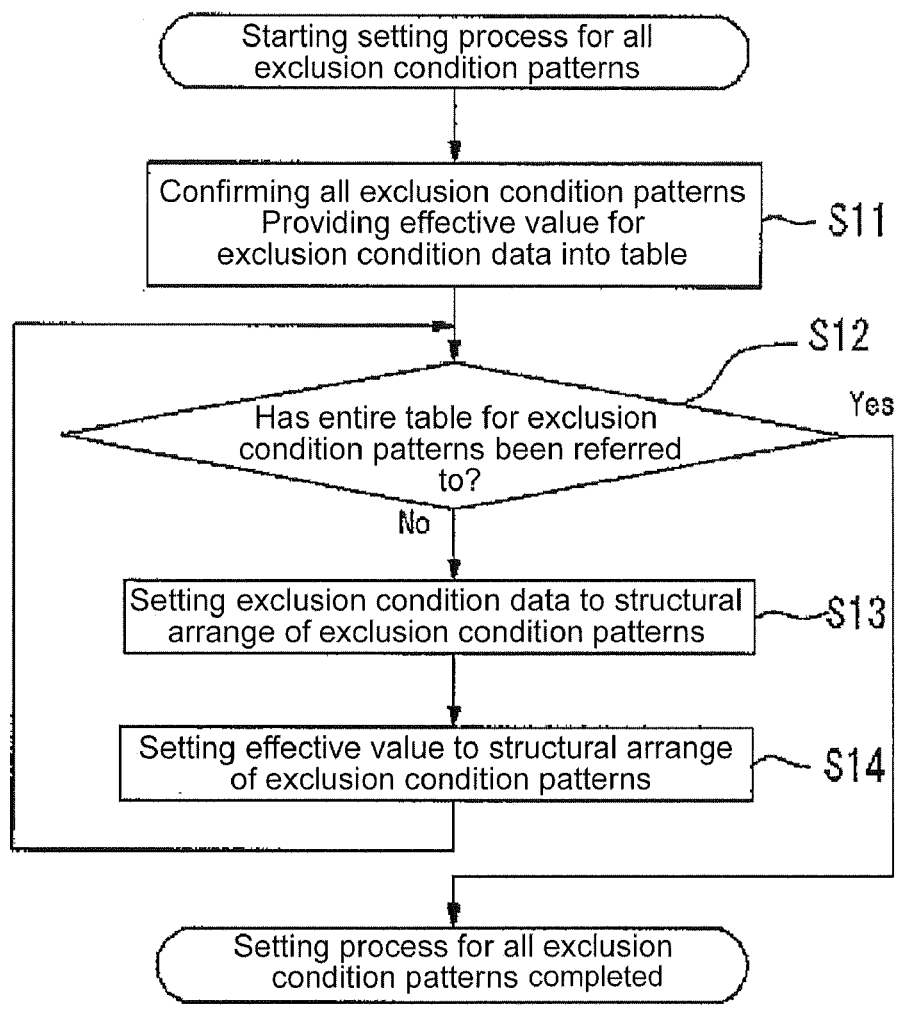
FIG. 7 is a flow chart for referring to the pattern of exclusion condition shown in FIG. 5.

The exclusion condition patterns P are set according to the flow shown in, for example, FIG. 7 when test apparatus 10 begins to be operated. Upon starting the process for setting all of the exclusion condition patterns, all of the exclusion condition patterns P is confirmed and a table is provided combining the effective values in exclusion condition data D (see FIG. 4) (step S11). Then, it is determined whether the entire table of exclusion condition patterns P has been referred to or not (step S12). If all of the exclusion condition patterns P has not been referred to, the exclusion condition data D to be confirmed is set to the structural arrange of the exclusion condition patterns P (step S13). Continuously, the effective values are set to the structural arrange of exclusion condition patterns P (step S14), and then, steps S12, S13 and S14 are repeated. At step S12, however, if it is determined that the entire table of exclusion condition patterns P has been referred to, the setting of all the exclusion condition patterns P is completed. For example, FIGS. 5(a) and 5(b) show the screen exclusion condition setting files made by the screen exclusion condition setting data set in the main screens 01 and 02.

Figure 8:
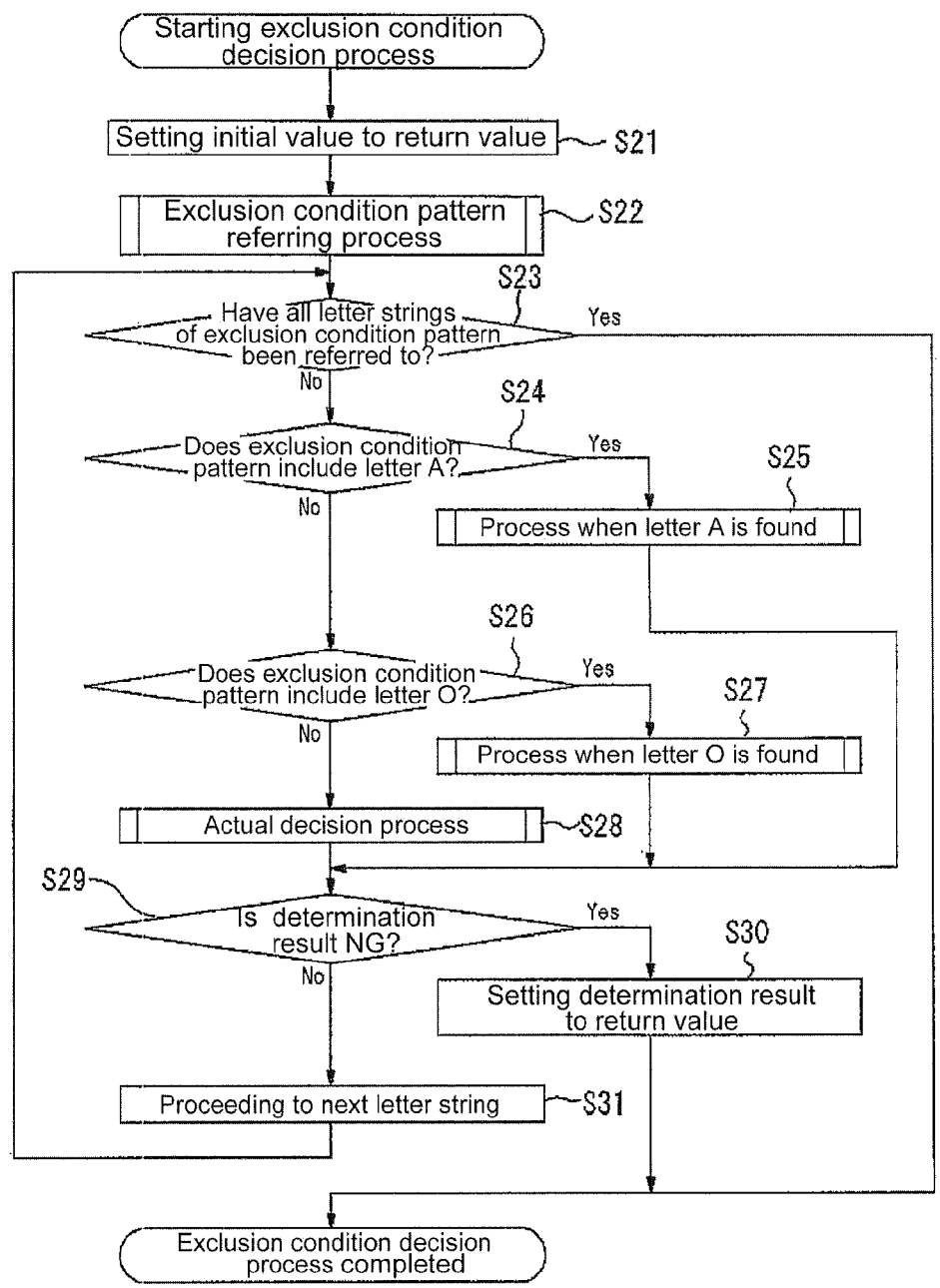
FIG. 8 is a flow chart illustrating the decision process of the exclusion condition.
Figure 9:
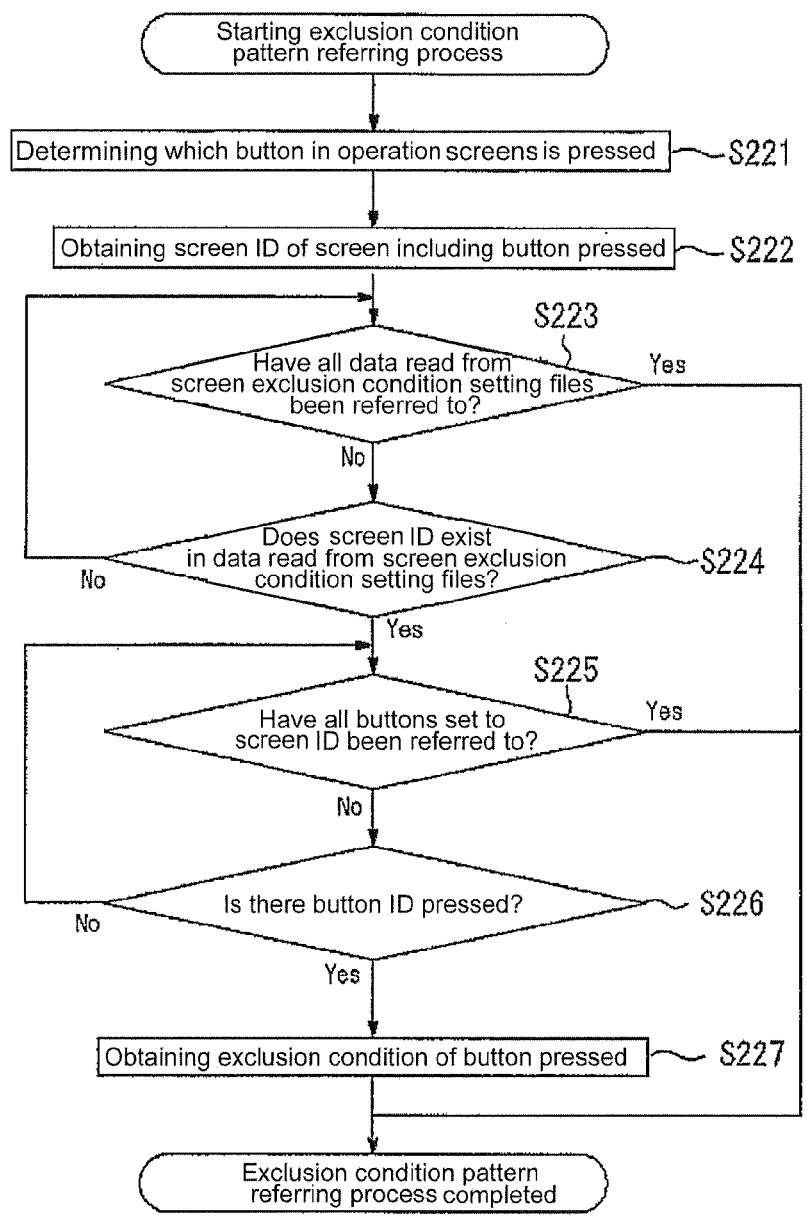
FIG. 9 is a flow chart illustrating a part of the decision process of the exclusion condition.

In case of restarting test apparatus 10 after setting the exclusion condition data D and the exclusion condition patterns P, screen IDs or button IDs are obtained in the table shown in FIGS. 5(a) and 5(b) from the screen exclusion condition setting files, and the exclusion condition corresponding to each button ID is set. As a result, the control process of the screen exclusion condition is performed. Upon pressing a button ID for operating the exclusion condition in each monitor 14, the exclusion condition corresponding to the button ID is operated according to the decision process of the exclusion condition as shown in FIG. 8. In FIGS. 5(a) and 5(b), the exclusion condition buttons are designated by button S1, button S2 and button S3.

The decision process of the exclusion condition process is operated, for example, as the exclusion condition is called out when a button ID is pressed in main screen 01. As a result, if the exclusion condition is satisfied, the button ID is excluded from the operating screen. If, however, the exclusion condition is not satisfied, the button ID is shown in the operating screen and can be pressed.

That is, as shown in FIG. 8, upon starting the decision process of the exclusion condition, after setting the return value with an initial value (step S21), the exclusion condition pattern P is referred to (step S22). The process for referring to the exclusion condition pattern P is operated, for example, according to the flow chart shown in FIG. 9. Upon starting the referring process, it is determined which screen's exclusion condition button (button ID with an exclusion condition) is pressed (step S221) and the screen ID of the screen with the pressed exclusion condition button (for example, main screen 01) is obtained (step S222). Then, it is determined whether all data read from the setting files of the screen exclusion condition have been referred to (step S223). If all data have not been referred to, it is determined whether there exist screen ID in the data read from the setting files of the screen exclusion condition (step S224). If it is determined at step S224 that screen ID does not exist, the process returns back to step S223 and then repeats the processing of step S223 and step S224. If it is determined at step S224 that the screen ID exists in the data read from the setting files of the screen exclusion condition, the process moves to step S225 and then determines whether all of the exclusion condition buttons set for the screen ID has been referred to or not.

It is determined from step S225 whether there is a button ID corresponding to the exclusion condition button pressed in the screen ID (step S226). If the button ID does not exist, the process returns to step S225 and then repeats the processing of step S225 and step S226. At step S226, if there is a button ID (for example, button S2) pressed in the screen ID, the exclusion condition of the button S2 is obtained (step S227) and the referring process of the exclusion condition patterns P is completed.

Also, if it is determined at step S223 that all of the data in the setting data of the screen exclusion condition has been referred to, or it is determined at step S225 that all the exclusion condition buttons set in the screen ID have been referred to, the referring process of the exclusion condition pattern of step S22 of the exclusion condition decision process is completed.

In the referring process of the exclusion condition pattern mentioned above, for example, when exclusion condition A(2:3) of button S2 in main screen 01 shown in FIG. 5(a) is obtained as an exclusion condition pattern P, as shown in FIG. 8, it is determined whether all of the letter strings of the exclusion condition pattern P has been referred to or not (step S23). If it is determined that all of the letter strings of the exclusion condition pattern P has not been referred to, it is then determined whether the letter strings of the exclusion condition pattern P include letter A indicating AND condition in the exclusion conditions (step S24). If letter A is found in the letter strings, the "process when A is found" starts according to the flow shown in FIG. 10.

If letter A is not found at step S24 of FIG. 8, it is then determined whether the letter strings include letter O indicating an exclusive OR condition (step S26). If, however, letter O is found in the letter strings, the "process when O is found" starts according to the flow shown in FIG. 11. If the letter strings do not include letter O, the condition for a button press is determined based on the letter strings (for example, 1, 2, etc.) (step S28), and it is then determined whether the determination is NG (not satisfying the button press conditions) or not (step S29). If the determination is NG, the return value is set with the determination result (step S30) and the determination of the exclusion condition is completed. If, however, the determination is not NG, the letter strings of the exclusion condition pattern P are progressed to the last (step S31), and then, the process returns to step S23. When all the letter strings of the exclusion condition pattern P have been referred to at step S23, the process for the exclusion condition determination is completed.

Figure 10:
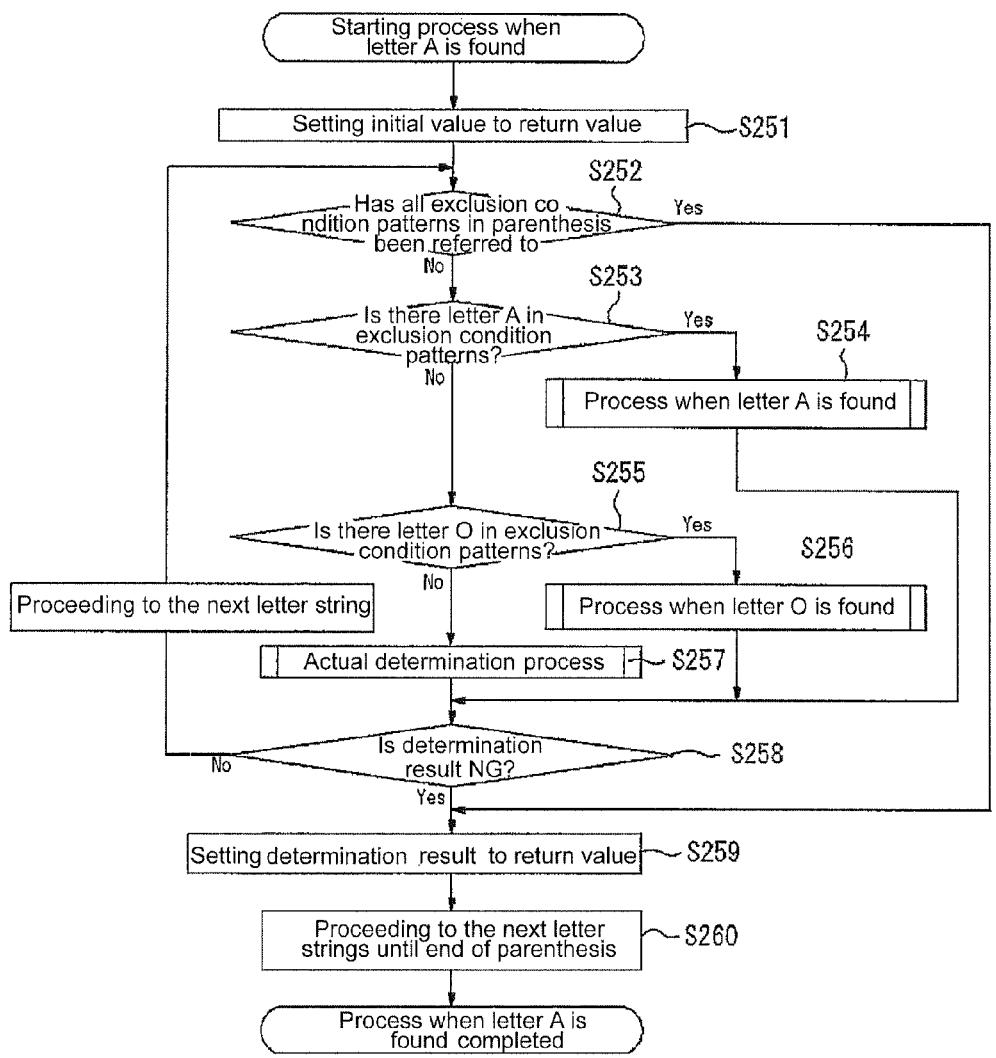
FIG. 10 is a flow chart illustrating another part of the decision process of the exclusion condition shown in FIG. 8.

However, since letter A indicating the AND condition is included in the letter strings of the exclusion condition A(2:3) of exclusion condition patterns P, the "process when A is found" starts as mentioned above. The "process when A is found" is operated according to the flow shown in FIG. 10. That is, in the process, after setting the return value with the initial value as shown in FIG. 10 (step S251), it is determined whether all of the letter strings of the exclusion condition patterns P in the parenthesis of letter A has been referred to or not (step S252). If it is determined that all of the letter strings of the exclusion condition patterns P has not been referred to, it is then determined whether letter A of the exclusion condition patterns is included in the parenthesis (step S253). If it is determined at step S253 that letter A is included there, the "process when A is found" is operated (step S254). However, since the letter A is not included in the parenthesis here, it is continuously determined whether the letter O indicating an exclusive OR condition patterns is included in the parenthesis or not (step S255). If it is determined at step S255 that the letter O is included, the "process when O is found" is operated (step S256). However, since the letter O is not included, the condition for the button press indicated by the numerals in the parenthesis of the exclusion condition A(2:3) are determined (step S257). Here, it is determined at least that "is the carrier set in load port 15?" of the condition for the button press No. 2. If the determination result is not NG as a result of determination No. 2 at step S257, the condition of No. 2 of the button press conditions is satisfied. Continuously, the process proceeds to the next letter string and repeats step S252 through step S258 so as to determine another button press condition of No. 3 of "is load port 15 on test?". If the determination is not NG, the process returns to step S252 and all of the exclusion condition patterns P in the parenthesis are referred to. Since all of the exclusion condition patterns in the parenthesis are referred to in this case, the determinations are set to the return value (step S259). The process to the letter strings of the exclusion conditions proceeds to the end of the parenthesis (step S260), and the "process when A is found" is completed.

After completing the "process when A is found" shown in FIG. 10, the determination result is returned to step S25 shown in FIG. 8, and the process proceeds from step S25 to step S29. At step S29, it is determined whether the exclusion condition A(2:3) is NG or not. Since the determination is not NG and the exclusion condition is satisfied in this example, the process proceeds to the letter strings of the next exclusion condition pattern (step S31). Although all of the letter strings of the next exclusion condition patterns is referred to at step S23, the next exclusion condition pattern does not exist in this exclusion condition pattern P. Thus, since all of the letter strings has been referred to, the decision process for the exclusion condition is completed. Because the exclusion condition A(2:3) of the button S2 is satisfied in this exclusion condition decision process, the button S2 is excluded and is not displayed on any operating screen. Accordingly, the button S2 cannot be pressed from any operating screen of the other monitor 14.

Meanwhile, at step S258 of the "process when A is found" shown in FIG. 10, if it is determined that the button press condition of No. 2 in the parenthesis of the exclusion condition A(2:3) is NG, that is, the exclusion condition is not satisfied, the determination result is set to the return value (step S259) and the process to the letter strings of the exclusion conditions proceeds to the end of the parenthesis (step S260). Also, another button press condition of No. 3 is confirmed and the "process when A is found" is then completed. After the process returns to step S25 shown in FIG. 8, it is determined at step S29 whether the determination result is NG or not. Since the determination is NG in this case, the determination result is set to the return value and the exclusion condition decision process is completed. Because the exclusion condition A(2:3) of the button S2 is not satisfied in this exclusion condition decision process, the button S2 is displayed on the operation screen and can be pressed from any operation screen of monitors 14.

Also, at step S22 of the decision process of the exclusion condition shown in FIG. 8, when the button press condition of No. 1 of the button S1 in main screen 01 shown in FIG. 5(*a*) is obtained, since the letters A and O are not included in the letter strings even referred to the letter string, via step S23, S24 and S26, the button press condition of No. 1 of "is the operation mode of the main screen system mode?" is determined at step S28. If the determination is not NG (step S29), the process proceeds to other letter strings (step S31) and returns back to step S23 so as to determine whether all the letter strings are referred to. Since all the letter strings are referred to in this case, the decision process of the exclusion condition is completed. Because the exclusion condition of button press condition No. 1 is satisfied in this exclusion condition determination process, the system mode corresponding to the button S1 is not displayed in main screen 01 and the system mode cannot be used in other operation screens. In contrast, if the determination of the exclusion condition decision process is NG and the exclusion condition of the button press condition No. 1 is not satisfied, the system mode is displayed in main screen 01 and can be operated from other operation screens.

Also, at step S22 of the exclusion condition decision process shown in FIG. 8, for example, upon obtaining A(A(1:2):O(3:4):5) as an exclusion condition pattern P1 and completing process for referring to the exclusion condition pattern P1, the process proceeds from step S22 to step S23 so as to determine whether all of the letter strings of the exclusion condition A(A(1:2):O(3:4):5) has been referred to. If all of the letter strings has not been referred to, it is determined at step S24 whether the letter A is included in the letter strings of the exclusion condition pattern. If it is determined that the letter strings include letter A, the process proceeds to step S25 and operates the "process when A is found." This process is operated according to the flow shown in FIG. 10 as mentioned above.

In the "process when A is found", as shown in FIG. 10, after setting the initial value to the return value (step S251), it is determined whether all of the letter strings of the exclusion condition in the parenthesis of the exclusion condition A has been referred to (step S252). If it is determined that the entire exclusion condition pattern has not been referred to, it is then determined whether another letter A is included in the parenthesis of the letter A of the exclusion condition pattern P1 (step S253). In this case, since the letter A is also included in the exclusion condition A(1:2) in the parenthesis, the process proceeds to step S254 and operates the "process when A is found." This process is operated in the same manner as the case of the exclusion condition A(2:3) mentioned above. If the "process when A is found" is completed, the process returns back to the "process when A is found" of step S25 shown in FIG. 8. After proceeding to step S29, it is determined whether the determination result is NG or not.

At step S258 shown in FIG. 10, if the button press condition of No. 1 in the parenthesis of the exclusion condition A(1:2) is not satisfied and the NG determination is issued, the determination result is set to the return value and the "process when A is found" of the exclusion condition A(1:2) is completed. While the process returns back to the "process when A is found" of step S25 shown in FIG. 8, it is determined at step S29 whether the determination is NG or not. Since the determination is NG in this case, the determination result is set to the return value (step S30) and the exclusion condition decision process of the exclusion condition pattern P1 is completed. Because the exclusion condition pattern P1 does not satisfy the exclusion condition in this exclusion condition decision process, the operation button of the exclusion condition pattern P1 can be displayed and pressed in any operation screens of the monitors.

On the contrary, if all of the button press conditions of Nos. 1 and 2 in the parenthesis of the exclusion condition A(1:2) at step S258 shown in FIG. 10 are not NG and satisfies the exclusion condition, the determination result is set to the return value and the "process when A is found" of the exclusion condition A(1:2) is completed. The process then returns back to the "process when A is found" of step S25 sown in FIG. 8 and it is determined at step S29 whether the determination is NG or not. Since the determination is not NG in this case, the process proceeds to the next letter strings in the parenthesis of the exclusion condition pattern P1. After returning back to step S23, it is determined whether all of the letter strings of the exclusion condition pattern P1 has been referred to. Since there are letter strings in this case, the process proceeds to step S24 and it is determined whether a following letter A exists or not. Because the letter A is not included in this case, the process proceeds to step S26 and it determined whether the letter O exists or not. Because the letter O is included in the exclusion condition O(3:4) in this case, the process proceeds to step S27 and operates the "process when A is found." This process is operated according to the flow shown in FIG. 11.

Figure 11:
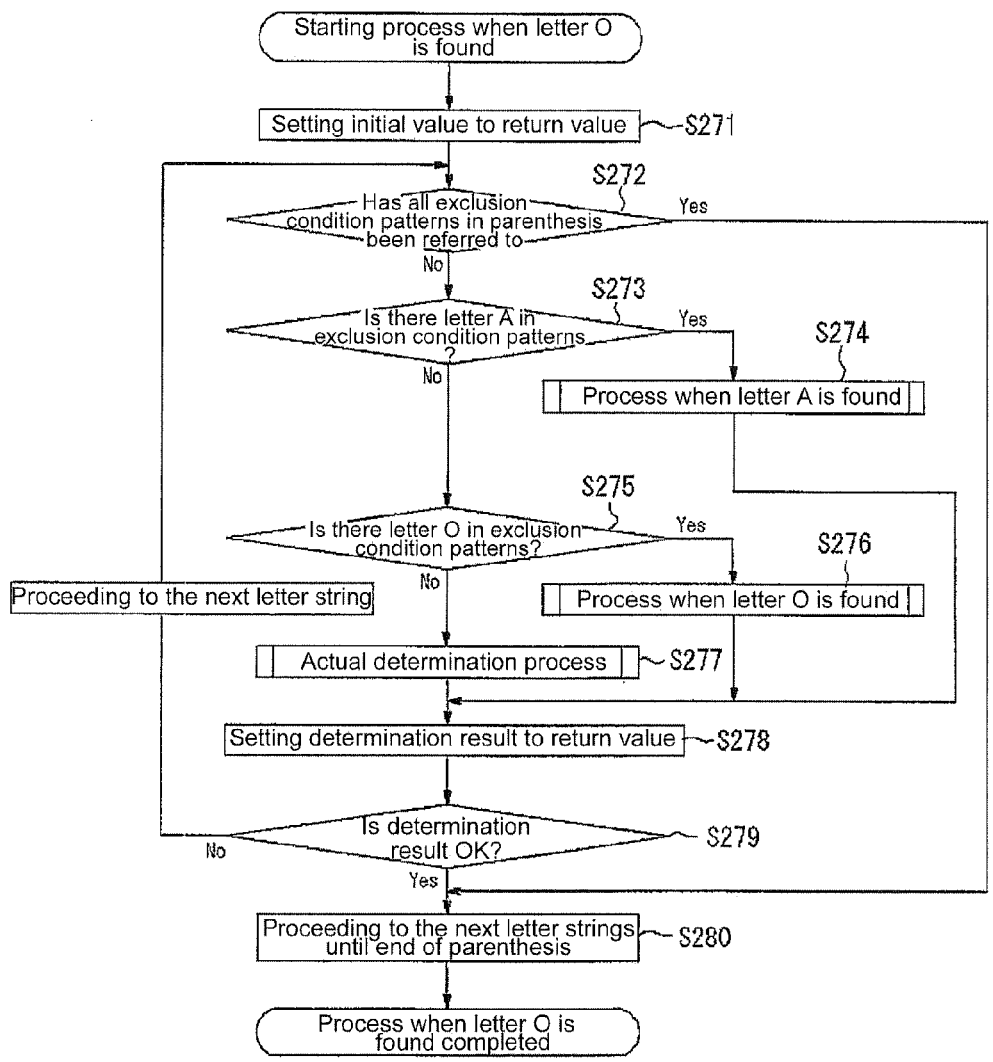
FIG. 11 is a flow chart illustrating yet another part of the decision process of the exclusion condition shown in FIG. 8.
Figure 12:
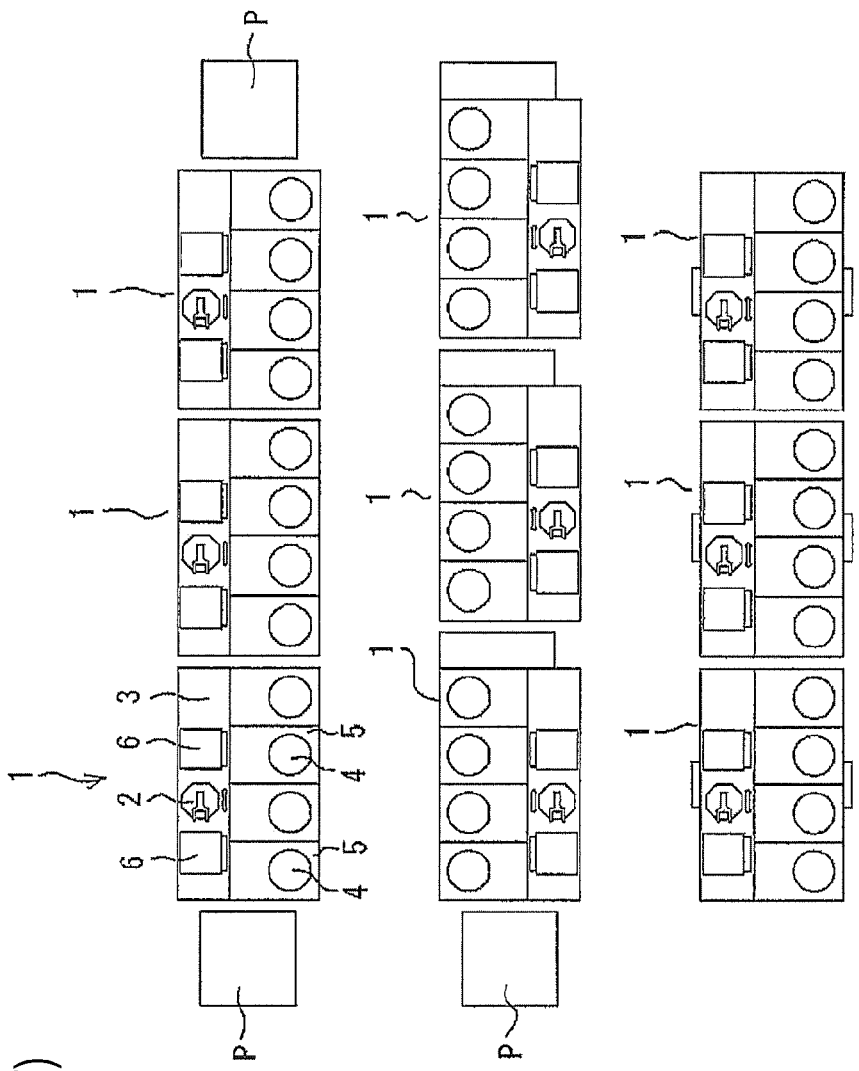
FIG. 12 is a top plan view illustrating a plurality of conventional test apparatuses disposed together.

In the "process when O is found", after setting the initial value to the return value as shown in FIG. 11 (step S271), it is determined whether all of the letter strings in the parenthesis of the exclusion condition O(3:4) of the exclusion condition pattern has been referred to (step S272). If it is determined that the entire exclusion condition pattern has not been referred to, it is then determined whether the letter A is included in the parenthesis (step S273). Since the letter A is not included in the parenthesis in this case, it is then determined whether the letter O is included in the parenthesis after proceeding to step S275. Because the letter O is also not included in this case, the button press condition of No. 3 in the parenthesis is determined (step S277). After setting the determination result to the return value (step S279), it is determined whether the determination result is OK or not (step S279). If the determination is OK and satisfies the exclusion condition, the other button press condition of No. 4 is confirmed (step S280) and the "process when A is found" is completed.

After completing the "process when O is found" shown in FIG. 11, the process returns back to step S27 shown in FIG. 8. Continuously, it is determined whether the determination of the exclusion condition O(3:4) of the exclusion condition pattern P1 is NG or not, after moving to step S29. Since the determination result is that the determination condition of O(3:4) is not NG, the process proceeds to the letter strings of the next exclusion condition pattern (step S31), and it is determined at step S23 that whether all of the letters of the exclusion condition pattern has been referred to. Because the exclusion condition is A(A(1:2):O(3:4):5) in the exclusion condition pattern P1, No. 5 of the button press condition remains.

Thus, the button press condition of No. 5 is determined at step S28 via step S24 and step S26. If the determination is not NG, the process returns back to step S23 via step S31, and it is determined whether all of the letter strings of the exclusion condition pattern P1 has been referred to. Since all of the letter strings has been referred to in this case, the exclusion condition decision process of the exclusion condition pattern P1 is completed. Because all of the conditions of the exclusion condition pattern P1 is satisfied in the exclusion condition decision process, the exclusion condition button of the exclusion condition pattern P1 is not displayed in any operation screens of monitors and cannot be pressed.

If the button press condition of No. 5 is determined to be NG at step S28 as mentioned above, the determination result is set to the return value (step S30), and the exclusion condition decision process of the exclusion condition pattern P1 is completed. In this exclusion condition decision process, the exclusion condition pattern P1 does not satisfy one of the AND conditions which is the button press condition of No. 5. Thus, since the condition of exclusion condition pattern P1 is not satisfied even if all the other prior exclusion conditions are satisfied, the exclusion condition button of the exclusion condition pattern P1 is displayed in any operation screens of monitors and can be operated.

As described above, according to the present exemplary embodiment, when operating test apparatus 10 having a plurality of stages 17 for testing wafers by using operation buttons displayed on the operating screens of each of a plurality of monitors 14, the exclusion condition buttons for excluding the operation buttons are set in the operation screens of at least one monitor 14, and the display of the screen satisfying the exclusion condition of at least one monitor is prevented in the other monitors 14, when pressing the exclusion condition button in the operation screen, by using the exclusion condition pattern P that combines the exclusion condition data D including necessary data for operating various functions of test apparatus 10 and exclusion conditions of the exclusion condition data D into data of whether each operation button can be pressed for operating each function thereof. Thus, in test apparatus 10 having 4 stages 17, by controlling the exclusion condition buttons according to the operation conditions of test apparatus 10, it is possible to prevent the operation button or the operation screen of one monitor 14 used for one stage 17 from being displayed on the other monitor 14, and control the other stage 17 via the other monitor 14. Therefore, the operation efficiency of test apparatus 10 can be remarkably increased.

Monitor 14 is configured to display 4 stage screens 14B each assigned for each stage 17, and main screen 14A besides stage screens 14B. Also, the operation modes are displayed in each of stage screens 14B and main screen 14A. The operation mode comprises an operator mode used for testing semiconductor wafers and a system mode used for conducting necessary operations while stopping stage 17. Thus, even if the maintenance is in progress by using one monitor 14, it is possible to exclude the other monitors from the one monitor 14 used for maintenance so as to proceed with testing in the other stages 17 in parallel with the maintenance. Therefore, the operation efficiency of test apparatus 10 can be remarkably increased.

Also, the present disclosure is not limited to the exemplary embodiment described above and each element may be properly modified as required.

The present disclosure may be properly applied to test apparatuses having a plurality of stages.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A method for operating a test apparatus having a plurality of stages for testing wafers by using an operation button in an operation screen displayed on each of a plurality of monitors, comprising:
    providing exclusion condition data that combines functional data required for operating various functions of the test apparatus into an exclusion condition, and an exclusion condition pattern that combines the exclusion condition into data for determining whether the operating button configured to operate each function can be pressed or not,
    providing an exclusion condition button to one or more monitors for excluding the operation button according to an operating condition of the test apparatus,
    determining the exclusion condition of the exclusion condition button with reference to the exclusion condition data and the exclusion condition pattern by pressing the exclusion condition button, and
    preventing a screen satisfying the exclusion condition on the one or more monitors from being displayed on other monitors based on the determining.

2. The method according to claim 1, wherein each of the monitors displays a plurality of stage screens, each of which is assigned to each stage, and a main screen in addition to the stage screens.

3. The method according to claim 2, wherein an operation mode is displayed on each of the stage screens and main screen, and the operation mode includes an operator mode used for testing semiconductor wafers and a system mode used for conducting a predetermined operation while stopping a selected stage.

4. The method according to claim 3, wherein, when the system mode is displayed on the one or more monitors, the other monitors do not display the system mode.

5. A computer-readable recording medium storing a computer executable program that, when executed, causes a computer to perform the method of claim 1 for operating a test apparatus having a plurality of stages for testing electrical characteristics of semiconductor wafers.

* * * * *